United States Patent
Han et al.

(10) Patent No.: US 7,732,770 B2
(45) Date of Patent: Jun. 8, 2010

(54) THIN FILM MULTI-LAYERED PYROELECTRIC CAPACITOR

(75) Inventors: Hui Han, Birmingham, AL (US); Sushma Kotru, Tuscaloosa, AL (US); Raghvendra Kumar Pandey, Austin, TX (US)

(73) Assignee: The Board of Trustees of the University of Alabama, Tuscaloosa, AL (US)

( * ) Notice: Subject to any disclaimer, the term of this patent is extended or adjusted under 35 U.S.C. 154(b) by 0 days.

(21) Appl. No.: 12/135,810

(22) Filed: Jun. 9, 2008

(65) Prior Publication Data

US 2008/0315100 A1     Dec. 25, 2008

Related U.S. Application Data

(60) Provisional application No. 60/944,981, filed on Jun. 19, 2007.

(51) Int. Cl.
*G01J 5/00* (2006.01)
(52) U.S. Cl. .................................. 250/338.3
(58) Field of Classification Search ............. 250/338.3, 250/342, 370.01, 338.4, 338.1
See application file for complete search history.

(56) References Cited

U.S. PATENT DOCUMENTS

| | | | |
|---|---|---|---|
| 4,825,079 A * | 4/1989 | Takamatsu et al. | 250/338.3 |
| 5,468,679 A * | 11/1995 | Paz de Araujo et al. | 438/3 |
| 6,294,783 B1 * | 9/2001 | Hayashi | 250/338.3 |
| 6,539,137 B1 * | 3/2003 | Moresco et al. | 385/14 |
| 7,397,301 B1 * | 7/2008 | Brocato | 329/347 |
| 2007/0108385 A1 * | 5/2007 | Mantese et al. | 250/338.3 |

OTHER PUBLICATIONS

Han et al.; *Highly a-axis-oriented Nb-doped Pb(TixZr1—x)O3 thin films grown by sol—gel technique for uncooled infrared detectors*; Applied Physics Letters; vol. 85, No. 22; Nov. 2004; pp. 5310-5312.
Han et al.;*Improved ferroelectric property of LaNiO3/Pb(Zr0.2Ti0.8)O3/LaNiO3 capacitors prepared by chemical solution deposition on platinized silicon*; Applied Physics Letters; vol. 88, 092902; Feb. 2006; pp. 1-3.

* cited by examiner

*Primary Examiner*—David P Porta
*Assistant Examiner*—Faye Boosalis
(74) *Attorney, Agent, or Firm*—Ballard Spahr LLP (57) ABSTRACT

Aspects described herein provide for the design and fabrication of a device with an enhanced pyroelectric response signal comprised of multi-capacitors that are connected in series. These capacitors are fabricated using multi-layers of materials such as lead zirconate titanate (PZT), $Ba_xSr_{1-x}TiO_3$ (barium strontium titanate) and $Bi_4Ti_3O_{12}$ (bismuth titanate) films that exhibit pyroelectric affect and belong to the class of polar materials. By controlling the poling direction of the multi-layer integrated structure, the pyroelectric voltage can be aligned in one direction, and as a result, the voltage output from the single element is the total contribution from each capacitor.

19 Claims, 6 Drawing Sheets

FIG. 1A

FIG. 1B: Electric field applied

FIG. 1C: Electric field removed

| Frequency | V Ratio of these two capacitor |
|---|---|
| 3 | 1.33 |
| 6 | 1.49 |
| 10 | 2.03 |
| 14 | 1.51 |
| 18 | 2.22 |
| 21 | 1.11 |
| 26 | 1.14 |

Pyroelectric Radiometer
FIG. 8A

Gas Sensor
FIG. 8B

Single element detector used in
- Non-contact temperature measurement
- Human motion sensor
- Alarm system

FIG. 8C

THIN FILM MULTI-LAYERED PYROELECTRIC CAPACITOR

CROSS-REFERENCE TO RELATED APPLICATION

This application claims priority to and benefit of U.S. Provisional Patent Application Ser. No. 60/944,981, filed Jun. 19, 2007, which is fully incorporated by reference herein and made a part hereof.

GOVERNMENT SUPPORT CLAUSE

This invention was made with government support under Grant DAAD19-02—1-0075 awarded by the U.S. Army Research Laboratory — Army Research Office. The government has certain rights in the invention.

FIELD OF THE INVENTION

The present invention generally pertains to detection devices. More particularly, to a pyroelectric capacitor configured to detect and respond to a temperature gradient.

BACKGROUND

The pyroelectric effect originates when a pyroelectric material is subjected to a temperature gradient causing a charge to develop across the capacitor's metal electrodes. This temperature gradient results in a current or a voltage signal originating from the material. This is called the pyroelectric effect. The magnitude of these signals is very small and must be monitored with great caution. Un-cooled infrared (IR) pyroelectric detectors make use of this pyroelectric property of a material. Unlike photonic detectors, which are based on semiconductors and must operate at very low temperatures, uncooled pyroelectric detectors do not require cryogenic cooling and can generally operate at room temperature, which is advantageous over photonic detectors requiring cryogenic cooling. Un-cooled detectors are lightweight, compact and have many applications including night vision imagers, gas sensors, human and animal body temperature detectors, alarm systems (fire and intruder), etc. All these devices except the night vision imagers have low density array and they usually operate in either the voltage mode or in the current mode. However, the detection signal is generally at very low levels and requires sophisticated amplification before utilization.

Therefore, what is needed is a pyroelectric capacitor configured to provide signals, either voltage or current, with a sensitivity sufficient for low-density arrays and with a greater signal strength than conventional pyroelectric capacitors. The described invention overcomes many of the challenges found in the art, some of which are described above.

SUMMARY

In various aspects, embodiments according to the present invention provide for the design and fabrication of a device with an enhanced pyroelectric response from a single sensing element comprised of multi-capacitors that are connected in series. These capacitors are fabricated using multi-layers of materials such as lead zirconate titanate (PZT) films that exhibit pyroelectric effect and belong to the class of polar materials. Other such pyroelectric materials include, for example, $Ba_xSr_{1-x}TiO_3$ (barium strontium titanate) and $Bi_4Ti_3O_{12}$ (bismuth titanate). By controlling the poling direction of the multi-layer integrated structure, the pyroelectric voltage can be aligned in one direction, and as a result, the voltage output from the single element is the total contribution from each capacitor. Based on experimental results, detectors fabricated using embodiments according to the present invention have higher IR sensitivity than conventional pyroelectric IR devices operated in voltage mode. Also, detectors according to the present invent are compact and lightweight.

In one aspect, a pyroelectric device is provided and comprised of a plurality of layers of polar dielectric material having a pyroelectric coefficient, p, and a plurality of conductive electrodes, wherein each conductive electrode is substantially in contact with at least a portion of one surface of a respective one of said plurality of layers of polar dielectric material. The electrodes are electrically connected in a series configuration as to form a series of capacitors comprised of the plurality of layers of dielectric material and the plurality of conductive electrodes. The configuration results in enhanced IR detection capabilities of said pyroelectric device with a greater output response than conventional single-element IR detectors.

In one aspect, the polar dielectric material of the pyroelectric device is comprised of PZT and the electrodes are comprised of platinum.

In another aspect, the pyroelectric device has an output response that is up to 103 percent greater than the output response of a single-element IR detection device.

In one aspect, the output response of the pyroelectric device is an output voltage.

In one aspect, the output response of the pyroelectric device is an output current.

In another aspect, the pyroelectric device comprises an IR detector with higher signal to noise ratio and higher IR sensitivity. However, for many applications these devices will also require an output signal amplifier, but they will need to amplify a much stronger signal than currently available in commercially sold single element detectors, thus making the amplifier design simpler.

Additional advantages of the invention will be set forth in part in the description which follows, and in part will be obvious from the description, or may be learned by practice of the invention. It is to be understood that both the foregoing general description and the following detailed description are exemplary and explanatory only and are not restrictive of the invention.

DETAILED DESCRIPTION OF THE DRAWINGS

The accompanying drawings, which are incorporated in and constitute a part of this specification, illustrate certain aspects of the instant invention and together with the description, serve to explain, without limitation, the principles of the invention and like reference characters used therein indicate like parts throughout the several drawings.

DETAILED DESCRIPTION

The present invention may be understood more readily by reference to the following detailed description of the invention and the examples included therein and to the figures and their previous and following description.

Before the present systems, articles, devices, and/or methods are disclosed and described, it is to be understood that this invention is not limited to specific systems, specific devices, or to particular methodology, as such may, of course, vary. It is also to be understood that the terminology used herein is for the purpose of describing particular embodiments only and is not intended to be limiting.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used in the specification and the appended claims, the singular forms "a," "an" and "the" include plural referents unless the context clearly dictates otherwise. Thus, for example, reference to "a layer" includes two or more such layers, and the like.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

It is also understood that when a value is disclosed that "less than or equal to" the value, "greater than or equal to the value" and possible ranges between values are also disclosed, as appropriately understood by the skilled artisan. For example, if the value "10" is disclosed the "less than or equal to 10" as well as "greater than or equal to 10" is also disclosed. It is also understood that throughout the application, data is provided in a number of different formats and that this data represents endpoints and starting points, and ranges for any combination of the data points. For example, if a particular data point "10" and a particular data point 15 are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

"Optional" or "optionally" means that the subsequently described event or circumstance may or may not occur, and that the description includes instances where said event or circumstance occurs and instances where it does not. As used herein, "exemplary" means "an example of" and is not intended to convey a preferred or ideal embodiment. Similarly, "such as" as used herein is not intended to be interpreted in a restrictive sense, but provides a non-limiting example of the subject matter being described.

Embodiments according to the present invention are described below with reference to block diagrams and flowchart illustrations of methods, apparatuses (i.e., systems) according to an embodiment of the invention. Accordingly, blocks of the block diagrams and flowchart illustrations support combinations of means for performing the specified functions and combinations of steps for performing the specified functions.

Figure 1A:
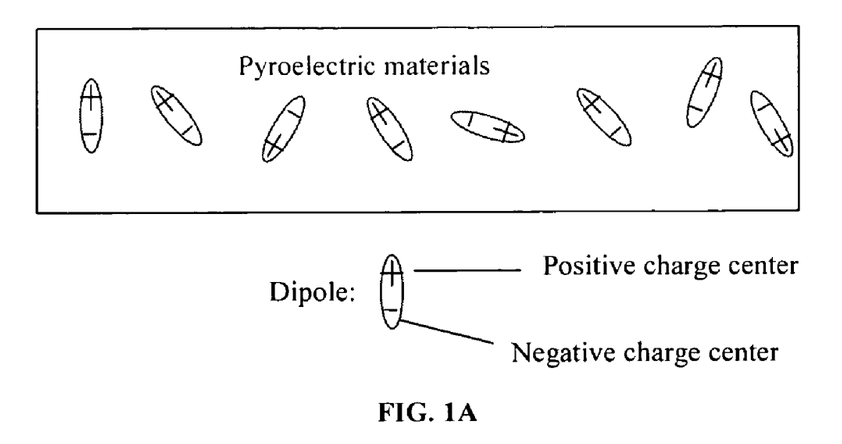
FIG. 1A is a schematic of randomly oriented dipoles in a pyroelectric material.

Pyroelectric effect is the change of the spontaneous polarization in certain anisotropy materials when subjected to a temperature gradient. Spontaneous polarization, Ps, is a property of ferroelectric materials such as barium titanate (BaTiO3) and lead zirconate titanate (PZT), among others. It is the volume density of dipole movement or surface charge density of the materials. An electric dipole is a separation of positive and negative charge, which could be regarded as a one unit in these materials. As for pyroelectric ceramics or polycrystalline thin films, these dipole movements point to random directions, as shown in FIG. 1A, which is a schematic of randomly oriented dipoles in a pyroelectric material.

Figure 1B:
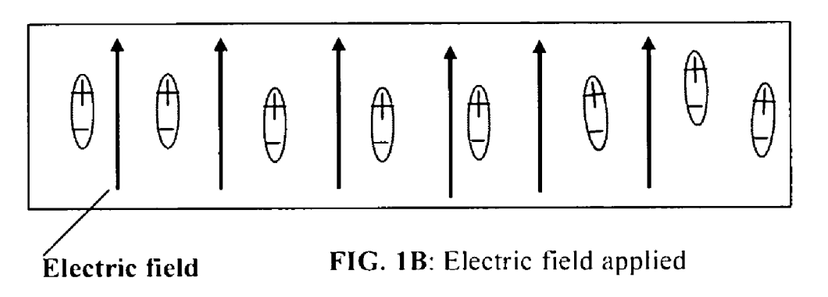
FIG. 1B illustrates the pyroelectric material while an electric field is applied.
Figure 1C:
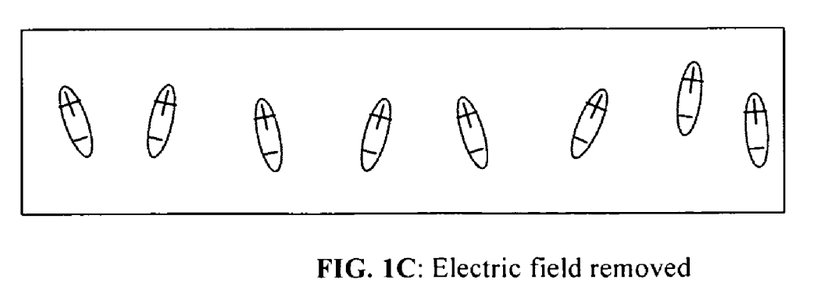
FIG. 1C illustrates the pyroelectric material once the electric field is removed.

In a microscopic view, the pyroelectric effect originates from the temperature dependence of relative distance between the positive charge center and negative charge center in the single dipole. If all the dipoles in the bulk material are randomly orientated (shown in FIG. 1A), because of thermal agitation and lattice vibration at room temperature, the pyroelectric effect cannot be observed in the macroscopic view. This can be overcome by polling of the pyroelectric materials by applying a dc (direct current) voltage across a pyroelectric capacitor so that the dipoles can be aligned in one direction under this electric field. Once this is achieved, even after removing the applied voltage, the dipoles generally maintain their alignment. This process can be understood with reference to FIGS. 1B and 1C, where FIG. 1B illustrates the pyroelectric material while the electric field is applied and FIG. 1C illustrates the pyroelectric material once the electric field is removed.

After poling, pyroelectric materials exhibit pyroelectricity at room temperature and above. Their pyroelectric coefficient can be determined macroscopically. That is, the poled pyroelectric materials can now be used to fabricate pyroelectric infrared sensors. In one aspect, the pyroelectric coefficient of PZT films used in embodiments according to the present invention is about $2\times10^{-4}$ C/m$^2$·K, though PZT having pyroelectric coefficients in the range of about $1$-$4\times10^{-4}$ C/m$^2$·K are also contemplated within the scope of this invention. This wide range of values is because the pyroelectric coefficient is dependent on the history of the materials. That is, how they are processed and characterized for pyroelectric effect. The pyroelectric coefficient for $Ba_xSr_{1-x}TiO_3$, which is also contemplated within the scope of this invention, is in the order of $2$-$4\times10^{-4}$ C/m$^2$·K, which is slightly higher than that of PZT.

Figure 2A:
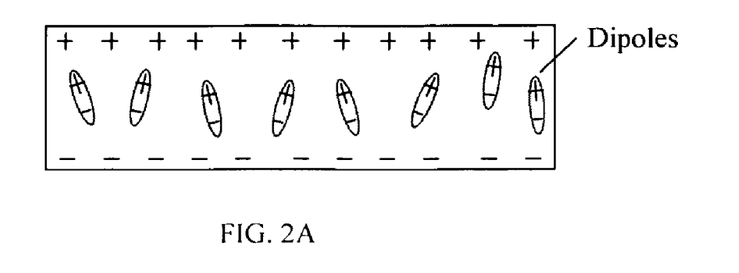
FIGS. 2A-2C illustrate the physical properties of the pyroelectric effect of a single-layer pyroelectric capacitor.
Figure 2B:
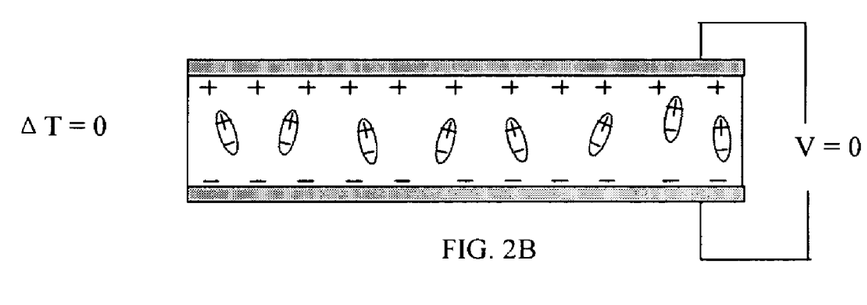
Figure 2C:
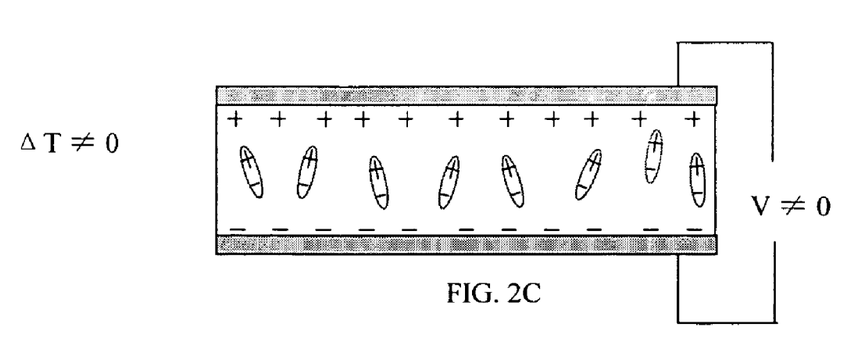

FIGS. 2A-2C illustrate the physical properties of the pyroelectric effect of a single-layer pyroelectric capacitor under different external conditions. FIG. 2A is a representative schematic of a poled pyroelectric material. Here, the aligned dipoles and accumulation of surface charges when the poling field is removed are shown. Surface charges on the faces of the capacitor based on a pyroelectric material will induce a voltage in open-circuit condition. In FIG. 2B, the pyroelectric material is shown with two conductive electrodes that substantially sandwich the pyroelectric material. Here, the pyroelectric capacitor does not exhibit a pyroelectric output because there is no change of temperature, i.e., absence of temperature gradient, which is dT/dt=0. The conductive electrodes are used for monitoring the pyroelectric voltage response in an electric circuit. In FIG. 2C, incident IR (not shown) causes a change in the temperature gradient, dT/dt, thus affecting the polarization of the material such that a voltage develops across the conductive electrodes of the pyroelectric capacitor.

The equivalent pyroelectric current flowing through a closed circuit condition is determined by the equation:

$$I = A \cdot p \cdot \frac{dT}{dt},$$

where p is the pyroelectric coefficient, T is temperature, t is time, and A is the area of the capacitor. The pyroelectric current, I, can be monitored as a pyroelectric voltage drop, V, across an external resistor. As can be seen from the equation, the larger the p of the pyroelectric material, the better the sensitivity and performance of an IR detector comprised of the pyroelectric material.

Figure 3:
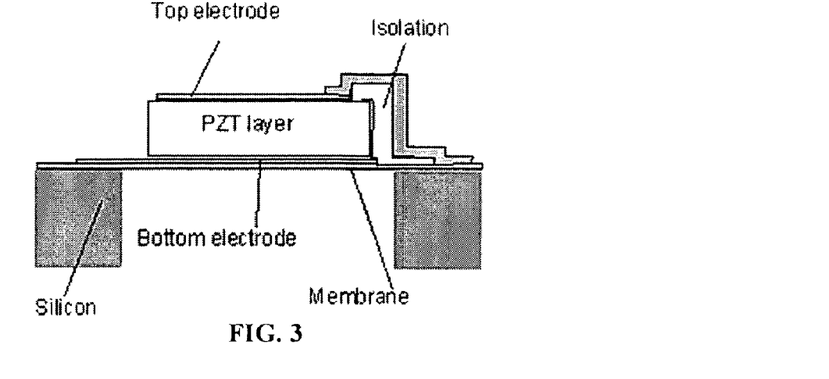
FIG. 3 is a cross-sectional view of a single-layer pyroelectric capacitor.

FIG. 3 is a cross-sectional view of a single-layer pyroelectric capacitor. As shown in FIG. 3, the capacitor is comprised of a single layer of polar dielectric material substantially between two conductive electrodes. The electrodes and their leads are generally electrically isolated from other components and ground. In one aspect, the electrodes can be platinum and the polar dielectric material PZT. The embodiment shown in FIG. 3 is a conventional un-cooled IR detector as can be found in devices such as night vision imagers, gas sensors, etc.

Figure 4:
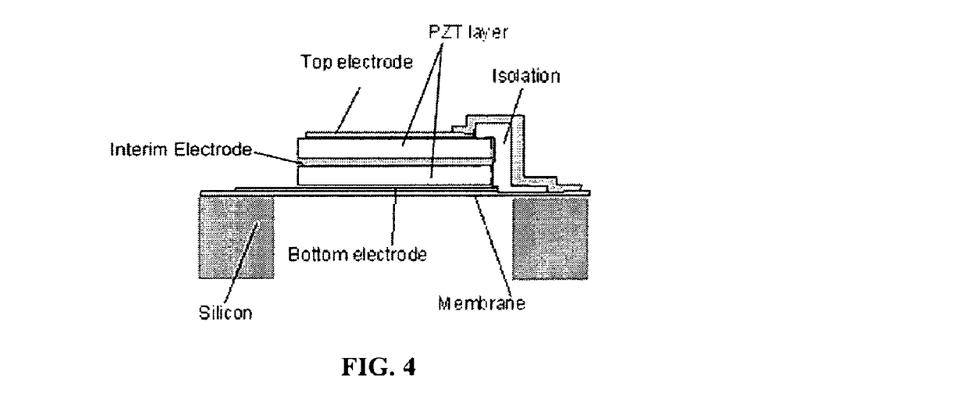
FIG. 4 is a cross-sectional view of an embodiment of a multilayer-layer pyroelectric capacitor according to the present invention.

FIG. 4 is a cross-sectional view of an embodiment of a multi-layer pyroelectric capacitor according to the present invention. In this aspect, the capacitor is comprised of multiple layers of polar dielectric material separated by conductive electrodes, which forms a plurality of capacitors electrically connected in series. In the embodiment shown in FIG. 4, the layers are vertically stacked one on top of another, though this is not the only configuration contemplated within the scope of this invention. Similarly, the number of layers, and therefore the number of capacitors serially-connected can vary from two to as many as physically limited by the thermal capacitance of the structure. For instance, in one embodiment (as shown in FIG. 4), the capacitor can be comprised of a top electrode, a layer of polar dielectric material, an interim electrode, another layer of polar dielectric material, and a bottom electrode. This configuration results in two capacitors connected in series. In one aspect, the polar dielectric material is as lead zirconate titanate (PZT) and the electrodes are platinum, though other materials are contemplated within the scope of this invention, such as polar dielectric material comprised of $Ba_xSr_{1-x}TiO_3$ (barium strontium titanate) or $Bi_4Ti_3O_{12}$ (bismuth titanate) films, or electrodes comprised of gold, iridium oxide, or other conductive oxides such as super-conducting 123 YBCO. In one aspect (not shown) the multi-layer pyroelectric capacitor is comprised of a platinum top electrode, a first layer of PZT, a first interim platinum electrode, a second layer of PZT, a second interim platinum electrode, a third layer of PZT, and a platinum bottom electrode. This configuration results in three capacitors electrically connected in series.

Figure 5:
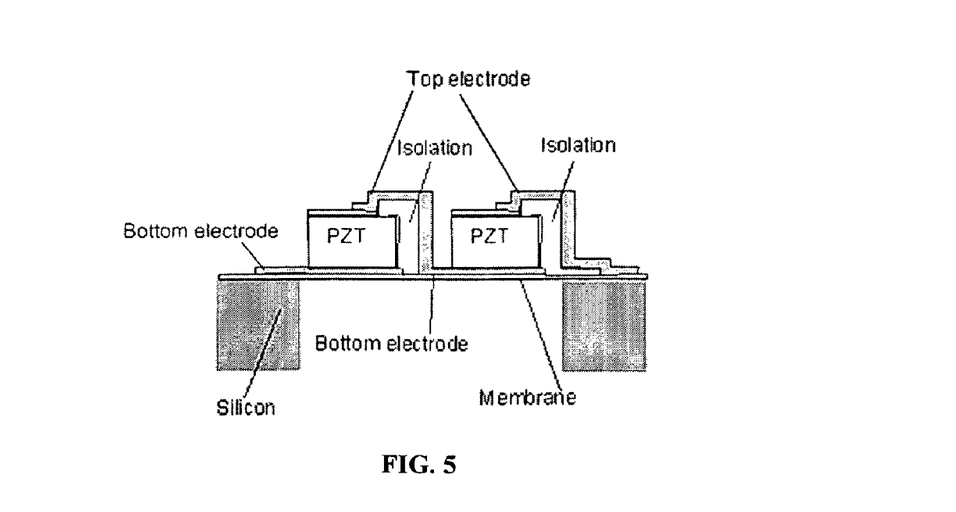
FIG. 5 is a cross-sectional view of another embodiment of a multilayer-layer pyroelectric capacitor according to the present invention.

FIG. 5 is a cross-sectional view of another embodiment of a multilayer-layer pyroelectric capacitor according to the present invention. In this embodiment, the layers are not stacked vertically one on top of another, but are arranged horizontally or laterally such that they are electrically interconnected by leads that run from the top electrode of one top electrode-polar dielectric material-bottom electrode stack to the bottom electrode of an adjacent stack. Each stack forms a capacitor and the leads form a serial connection between the stacks. This configuration can be advantageous because the thermal capacitance of the structure does not change in the lateral configuration of single capacitors in series.

Figure 6A:
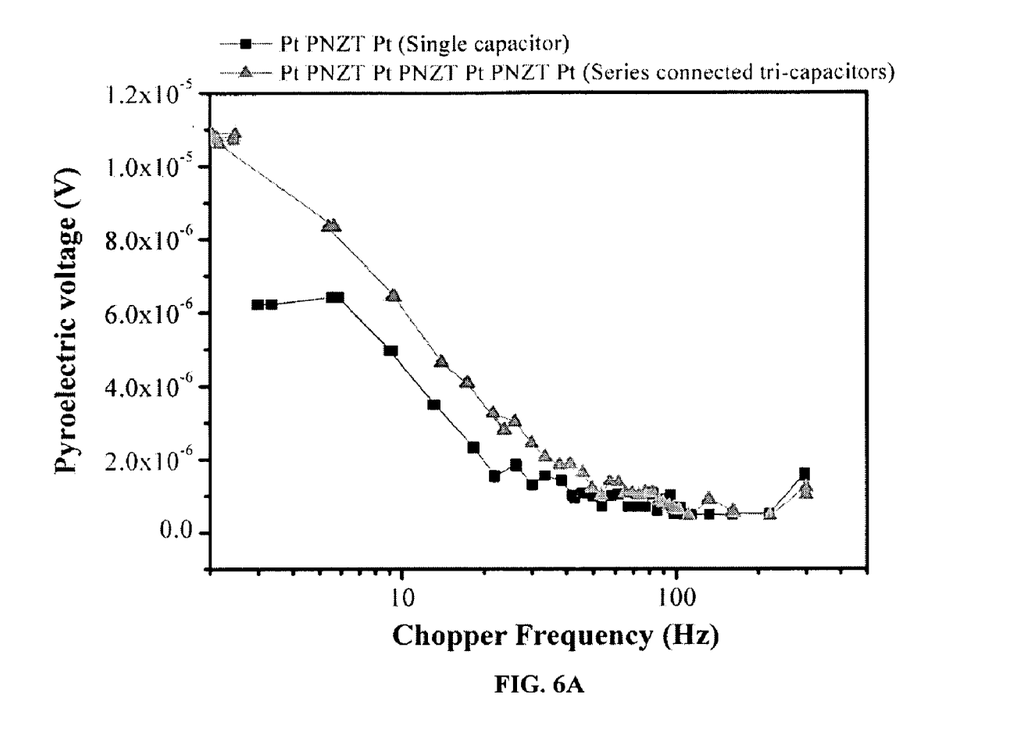
FIG. 6A is a graph showing test results comparing capacitor voltage to IR chopper frequency in a single-layer pyroelectric capacitor and a multi-layered pyroelectric capacitor.
Figure 6B:
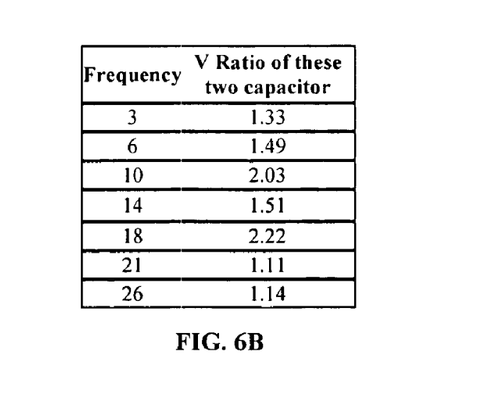
FIG. 6B is a table that corresponds to FIG. 6A and shows the voltage ratio of an embodiment of a multi-layer pyroelectric capacitor with respect to a single-layered pyroelectric capacitor at various chopper frequencies.

FIG. 6A is a graph showing test results comparing capacitor voltage to IR chopper frequency in a single-layer pyroelectric capacitor and a multi-layered pyroelectric capacitor. The single-layer capacitor is graphed using squares and the multi-layered capacitor according to an embodiment of the present invention is graphed using triangles. In this comparison, the single layer capacitor is comprised of a platinum top electrode, a layer of PZT, and a platinum top electrode (single capacitor). The multi-layered capacitor is comprised of a platinum top electrode, a first layer of PZT, a first interim platinum electrode, a second layer of PZT, a second interim platinum electrode, a third layer of PZT, and a bottom platinum electrode (series connected tri-capacitors). A chopper is known to one of ordinary skill in the art and serves to block/expose the capacitors to IR on a cyclical basis as determined by the frequency (per second). As can be seen in the graph of FIG. 6A, below 100 Hz, the pyroelectric voltage from the tri-capacitor according to an embodiment of the present invention is generally greater than that of the single capacitor at each measured frequency point. Specific voltage ratios between the multi-layered capacitor with respect to the single capacitor at designated frequencies is provided in the table shown in FIG. 6B. The table in FIG. 6B corresponds to FIG. 6A and shows the voltage ratio of an embodiment of a multi-layer pyroelectric capacitor with respect to a single-layered pyroelectric capacitor at various chopper frequencies. For example, at 10 Hz the voltage of the multi-layered capacitor is 103 percent greater than that of the single capacitor. Similarly, at 18 Hz, the voltage of the multi-layered capacitor is 122 percent greater than that of the single capacitor.

This greater voltage response signal can result in a simplified design and easier utilization of the multi-layered capacitor. For example, because the output signal in a single element detector is normally very small, it generally must be carefully filtered out and then amplified to make it practical. Filtering and amplification steps can be complicated, costly and time consuming. Aspects according to embodiments of the present invention enhance and boost the small pyroelectric signal by using multi-capacitor structure and thereby minimize challenges associated with filtering of weak signal and their subsequent amplification by using specialized signal amplifiers. Embodiments according to the present invention can produce output signal that cannot be confused with electronic noise.

Figure 7:
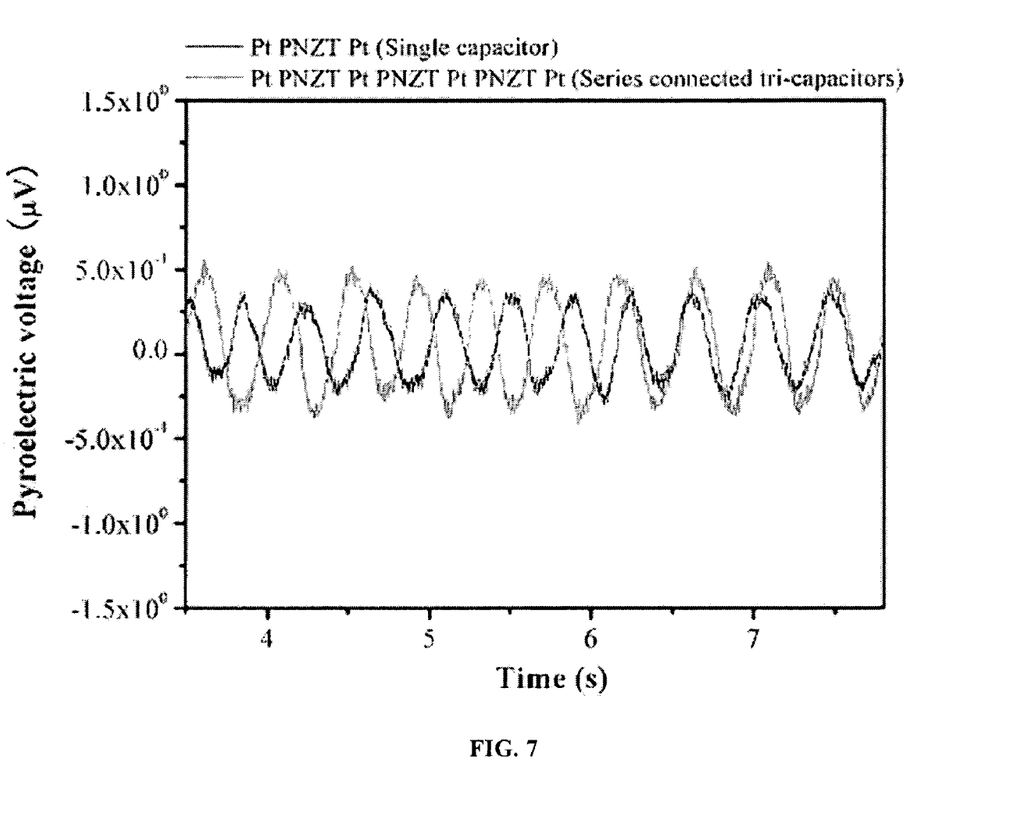
FIG. 7 is a graph showing test results comparing capacitor voltage to time (at a constant IR chopper frequency of 3 Hz) in a single-layer pyroelectric capacitor and a multi-layered pyroelectric capacitor.

FIG. 7 is a graph showing test results comparing capacitor voltage to time (at a constant IR chopper frequency of 3 Hz) in a single-layer pyroelectric capacitor and a multi-layered pyroelectric capacitor. In this instance, the single-layer capacitor is graphed using the dark line and the multi-layered capacitor according to an embodiment of the present invention is graphed using the lighter (grey) line. In this comparison, the single-layer capacitor is comprised of a platinum top electrode, a layer of PZT, and a platinum top electrode (single capacitor). The multi-layered capacitor is comprised of a platinum top electrode, a first layer of PZT, a first interim platinum electrode, a second layer of PZT, a second interim platinum electrode, a third layer of PZT, and a bottom platinum electrode (series connected tri-capacitors). As can be seen in FIG. 7, the responsiveness and the voltage magnitude of the multi-layered capacitor is generally better than that observed for the single-layer capacitor.

Figure 8A:
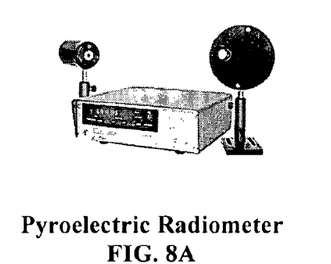
FIGS. 8A-8C illustrate some non-limiting exemplary uses of embodiments according to the present invention.
Figure 8B:
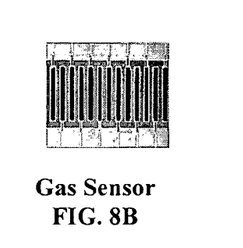
Figure 8C:
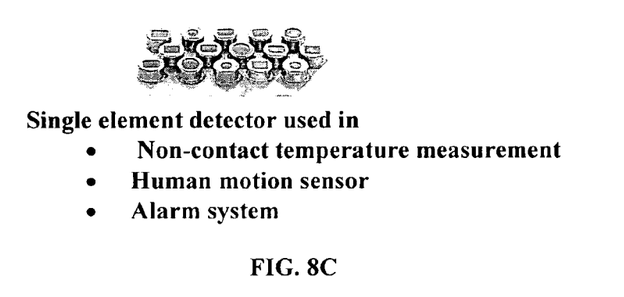

FIG. 8 illustrates some exemplary uses of embodiments according to the present invention. These exemplary uses can include, for example, replacing single-elements detectors that are currently used in pyroelectric radiometers, gas sensors, non-contact temperature measurement devices, motion sensors, alarm systems, fire detection, thermal management of microelectronic processing, etc., though these applications are not to be considered limiting.

Although several aspects of the present invention have been disclosed in the foregoing specification, it is understood by those skilled in the art that many modifications and other aspects of the invention will come to mind to which the invention pertains, having the benefit of the teaching presented in the foregoing description and associated drawings. It is thus understood that the invention is not limited to the specific aspects disclosed hereinabove, and that many modifications and other aspects are intended to be included within the scope of the appended claims. Moreover, although specific terms are employed herein, as well as in the claims which follow, they are used only in a generic and descriptive sense, and not for the purposes of limiting the described invention.

REFERENCES

Unless specifically excluded, the following are incorporated by reference in their entirety and made a part hereof:

[1] Hui Han, Xiuyu Song, Jian Zhong, Sushma Kotru, P. Padmini, and R. K. Pandey, "Highly α-axis-oriented Nb-doped Pb(TixZr1-x)O3 thin films grown by sol-gel technique for uncooled infrared detectors", *Appl. Phys. Lett.*, 85, 5310 (2004).

[2] H. Han, J. Zhong, S. Kotru, P. Padmini, X. Y. Song, and R. K. Pandey, "Improved ferroelectric property of LaNiO3/Pb(Zr0.2Ti0.8)O3/LaNiO3 capacitors prepared by chemical solution deposition on platinized silicon", *Appl. Phys. Lett.* 88, 092902 (2006).

[3] Hui Han a, Sushma Kotru b, Jian Zhong b and R. K. Pandey, "Effect of Nb doping on pyroelectric property of lead zirconate titanate films prepared by chemical solution deposition", *Sens. Actuators, A*, (in press.)

What is claimed is:

1. A pyroelectric device comprised of:
   a plurality of layers of a polar dielectric material having a pyroelectric coefficient, p, wherein each layer exhibits pyroelectric properties;
   a plurality of conductive electrodes, wherein each conductive electrode is substantially in contact with at least a portion of one surface of a respective at least one of said plurality of layers of polar dielectric material,
   wherein said electrodes are electrically connected in a series configuration as to form a series of capacitors comprised of said plurality of layers of polar dielectric material and plurality of conductive electrodes.

2. The pyroelectric device of claim 1, wherein at least one layer of said polar dielectric material is comprised of lead zirconate titanate (PZT), $Ba_xSr_{1-x}TiO_3$ (barium strontium titanate), or $Bi_4Ti_3O_{12}$ (bismuth titanate) films.

3. The pyroelectric device of claim 1, wherein at least one of said electrodes are comprised of platinum, gold, iridium oxide, or other conductive oxides such as super-conducting 123 YBCO.

4. The pyroelectric device of claim 1, wherein at least one layer of said polar dielectric material is comprised of lead zirconate titanate (PZT) and at least one of said electrodes are comprised of platinum.

5. The pyroelectric device of claim 1, wherein the pyroelectric device is comprised of a platinum top electrode, a first layer of PZT, a first interim platinum electrode, a second layer of PZT, a second interim platinum electrode, a third layer of PZT, and a platinum bottom electrode resulting in three capacitors electrically connected in series.

6. The pyroelectric device of claim 1, wherein said pyroelectric device has an output response resulting from exposure to infra-red (IR) radiation.

7. The pyroelectric device of claim 6, wherein and said configuration provides IR detection capabilities with a greater output response than conventional single-element IR detectors.

8. The pyroelectric device of claim 7, wherein the output response is up to 103 percent greater than the output response of the single-element IR detection device.

9. The pyroelectric device of claim 6, wherein the output response is an output current.

10. The pyroelectric device of claim 9, wherein the output current is determined by the equation:

$$I = A \cdot p \cdot \frac{dT}{dt},$$

where p is the pyroelectric coefficient, T is temperature, t is time, and A is the area of the series of capacitors.

11. The pyroelectric device of claim 10, wherein the output response is the pyroelectric current, I, monitored as a pyroelectric voltage drop, V, across an external resistor.

12. The pyroelectric device of claim 1, wherein the plurality of layers of a polar dielectric material and the plurality of conductive electrodes are stacked vertically one on top of another.

13. The pyroelectric device of claim 1, wherein the plurality of layers of a polar dielectric material and the plurality of conductive electrodes are arranged horizontally or laterally such that they are electrically interconnected by leads that run from the top electrode of one top electrode-polar dielectric material-bottom electrode stack to the bottom electrode of an adjacent stack such that each stack forms a capacitor and the leads form a serial connection between the stacks.

14. The pyroelectric device of claim 1, wherein said pyroelectric device is used in a pyroelectric radiometer, a gas sensor, a non-contact temperature measurement device, a motion sensor, an alarm system, or a fire detector.

15. The pyroelectric device of claim 1, wherein the series of capacitors comprises two capacitors.

16. The pyroelectric device of claim 1, wherein the series of capacitors comprises three capacitors.

17. The pyroelectric device of claim 1, wherein at least one of the plurality of layers of a polar dielectric material having a pyroelectric coefficient, p is comprised of lead zirconate titanate (PZT) having p in the range of about $1 \times 10^{-4}$ C/m²·K to about $4 \times 10^{-4}$ C/m²·K.

18. The pyroelectric device of claim 17, wherein p is about $2 \times 10^{-4}$ C/m²·K.

19. The pyroelectric device of claim 1, wherein at least one of the plurality of layers of a polar dielectric material having a pyroelectric coefficient, p, is comprised of $Ba_xSr_{1-x}TiO_3$ (barium strontium titanate) having p in the range of about $2 \times 10^{-4}$ C/m²·K to about $4 \times 10^{-4}$ C/m²·K.

* * * * *